United States Patent
Lee et al.

(10) Patent No.: US 7,314,853 B2
(45) Date of Patent: Jan. 1, 2008

(54) CLEANING SOLUTION FOR PHOTORESIST AND METHOD FOR FORMING PATTERN USING THE SAME

(75) Inventors: Geun Su Lee, Gyeonggi-do (KR); Sam Young Kim, Gyeonggi-do (KR); Keun Do Ban, Gyeonggi-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 729 days.

(21) Appl. No.: 10/875,924

(22) Filed: Jun. 24, 2004

(65) Prior Publication Data

US 2005/0074709 A1    Apr. 7, 2005

(30) Foreign Application Priority Data

Oct. 6, 2003 (KR) .................. 10-2003-0069239

(51) Int. Cl.
*C11D 1/72* (2006.01)

(52) U.S. Cl. ............................ 510/175; 134/1.3

(58) Field of Classification Search ............ None
See application file for complete search history.

(56) References Cited

U.S. PATENT DOCUMENTS

| | | | | |
|---|---|---|---|---|
| 3,515,701 A * | 6/1970 | Tiers | ............ | 528/361 |
| 3,985,810 A * | 10/1976 | von Halasz et al. | ........ | 568/615 |
| 4,914,161 A * | 4/1990 | Muller et al. | ............ | 525/403 |
| 4,925,917 A * | 5/1990 | Wife et al. | ............ | 528/392 |
| 2004/0072108 A1 * | 4/2004 | Hyon | ............ | 430/331 |

* cited by examiner

*Primary Examiner*—Gregory Webb
(74) *Attorney, Agent, or Firm*—Marshall, Gerstein & Borun LLP

(57) ABSTRACT

Disclosed herein are photoresist cleaning solutions useful for cleaning a semiconductor substrate in the last step of a developing step when photoresist patterns are formed. Also disclosed herein are methods for forming photoresist patterns using the solutions. The cleaning solutions of the present invention include $H_2O$ as a primary component, a surfactant as an additive, and optionally an alcohol compound. The cleaning solution of the present invention has lower surface tension than that of distilled water which has been used for conventional cleaning solutions, thereby improving resistance to pattern collapse and stabilizing the photoresist pattern formation.

13 Claims, 5 Drawing Sheets

CLEANING SOLUTION FOR PHOTORESIST AND METHOD FOR FORMING PATTERN USING THE SAME

BACKGROUND

1. Technical Field

The present invention relates to cleaning solutions for a photoresist which are useful for cleaning a semiconductor substrate in the last step of a development process when photoresist patterns are formed. More specifically, it relates to a cleaning solution for a photoresist comprising $H_2O$ as a primary component, a surfactant and an alcohol compound, and a method for forming patterns using the same.

2. Description of the Related Art

As semiconductor devices become smaller, the aspect ratio (thickness of photoresist, or height/linewidth of formed pattern) of a photoresist pattern increases. As a result, the pattern is collapsed during a cleaning process.

When the height of the formed photoresist pattern extends beyond a critical height, capillary forces exceed the elasticity of the photoresist, thereby resulting in collapse of the pattern during the cleaning process. In order to overcome this problem, the adhesive force between an underlying layer to be etched and the photoresist is enhanced by increasing inner elasticity of the photoresist or by decreasing the surface tension thereof.

Generally, a method of forming photoresist pattern on a semiconductor substrate comprises the steps of forming an underlying layer, to be etched on the semiconductor substrate, forming a photoresist film on a top portion of the underlying layer, exposing a portion of the underlying layer to light and developing the exposed substrate. In the case of a positive photoresist, the photoresist film of an exposed region is removed by a developing solution to form a desired photoresist pattern.

The last step of the above method is a cleaning process of removing the residual photoresist film by spraying distilled water from a top portion of a spin equipment while the semiconductor substrate is spinning. In such process, the pattern collapses due to high surface tension of the distilled water.

SUMMARY OF THE DISCLOSURE

In order to prevent pattern collapse in the developing step during ultrafine photoresist pattern formation of 130 nanometers (nm) width or less, the present inventors have employed a novel cleaning solution having reduced surface tension with a specified composition (instead of conventional, distilled water), and synthesized a novel surfactant having excellent solubility in water and lower reactivity with photoresist.

Accordingly, disclosed herein are cleaning solutions for photoresist patterns having reduced surface tension sufficient to prevent collapse of photoresist patterns in the last developing step to remove the residual photoresist film. Generally, the solution includes water as a primary solvent and a surfactant of Formula 1 as an additive

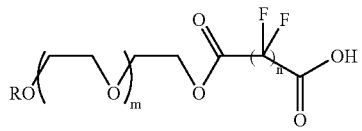

[Formula 1]

wherein

R is H, $C_8$-$C_{20}$ alkyl or alkylaryl group;

m is an integer ranging from 5 to 50; and n is an integer ranging from 3 to 50.

Also, disclosed herein are methods for forming photoresist patterns using the solution. One such method generally includes coating a photoresist on a top portion of an underlying layer formed on a semiconductor substrate and to be etched to form a photoresist film. The method also includes exposing the photoresist film to light, developing the exposed photoresist film in a developing solution, and cleaning the resulting material using one of the cleaning solutions described in the foregoing paragraph.

DETAILED DESCRIPTION OF THE PRESENT INVENTION

Figure 1:
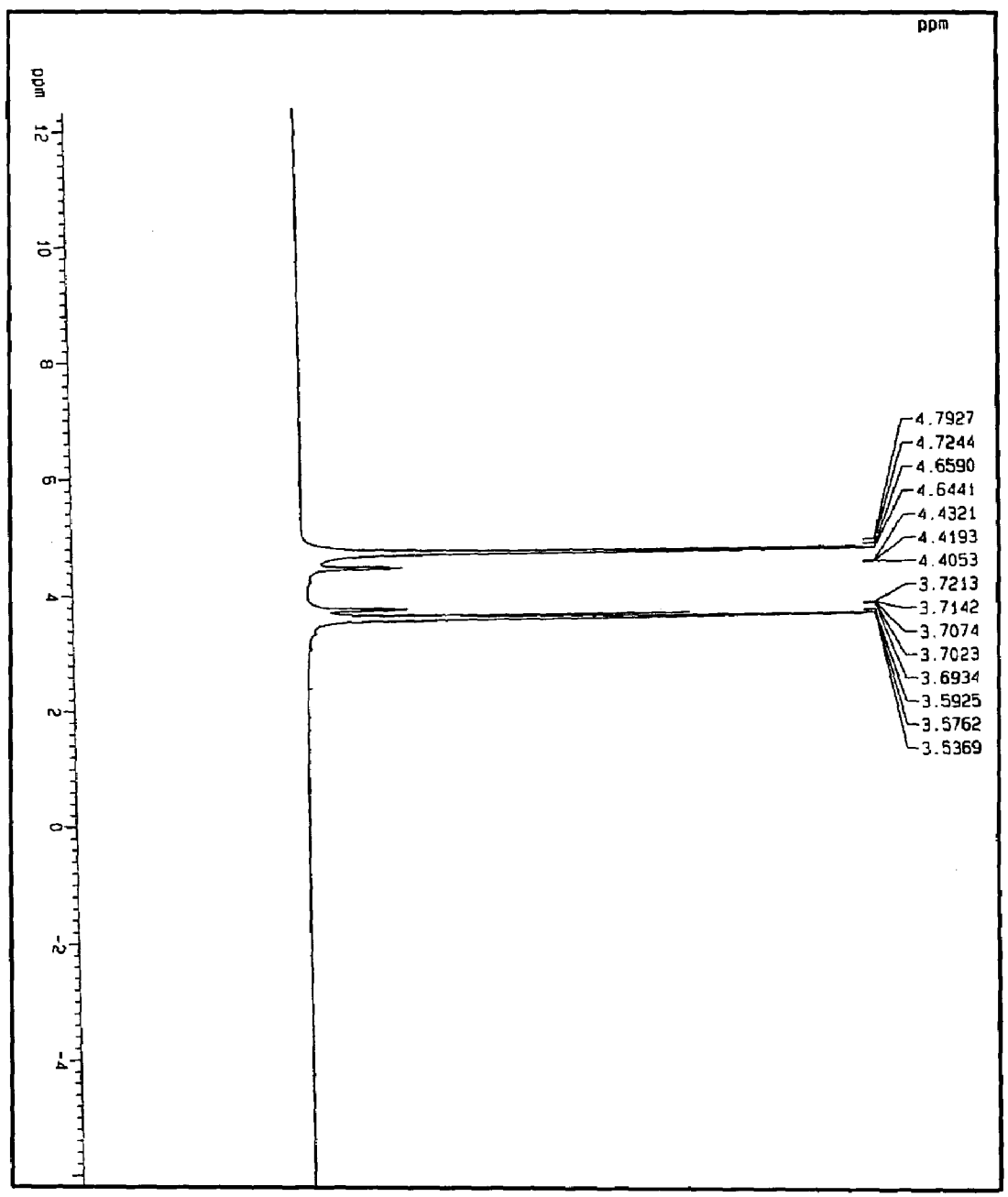
FIG. 1 is a NMR spectrum of a cleaning solution obtained from Example 1.
Figure 2:
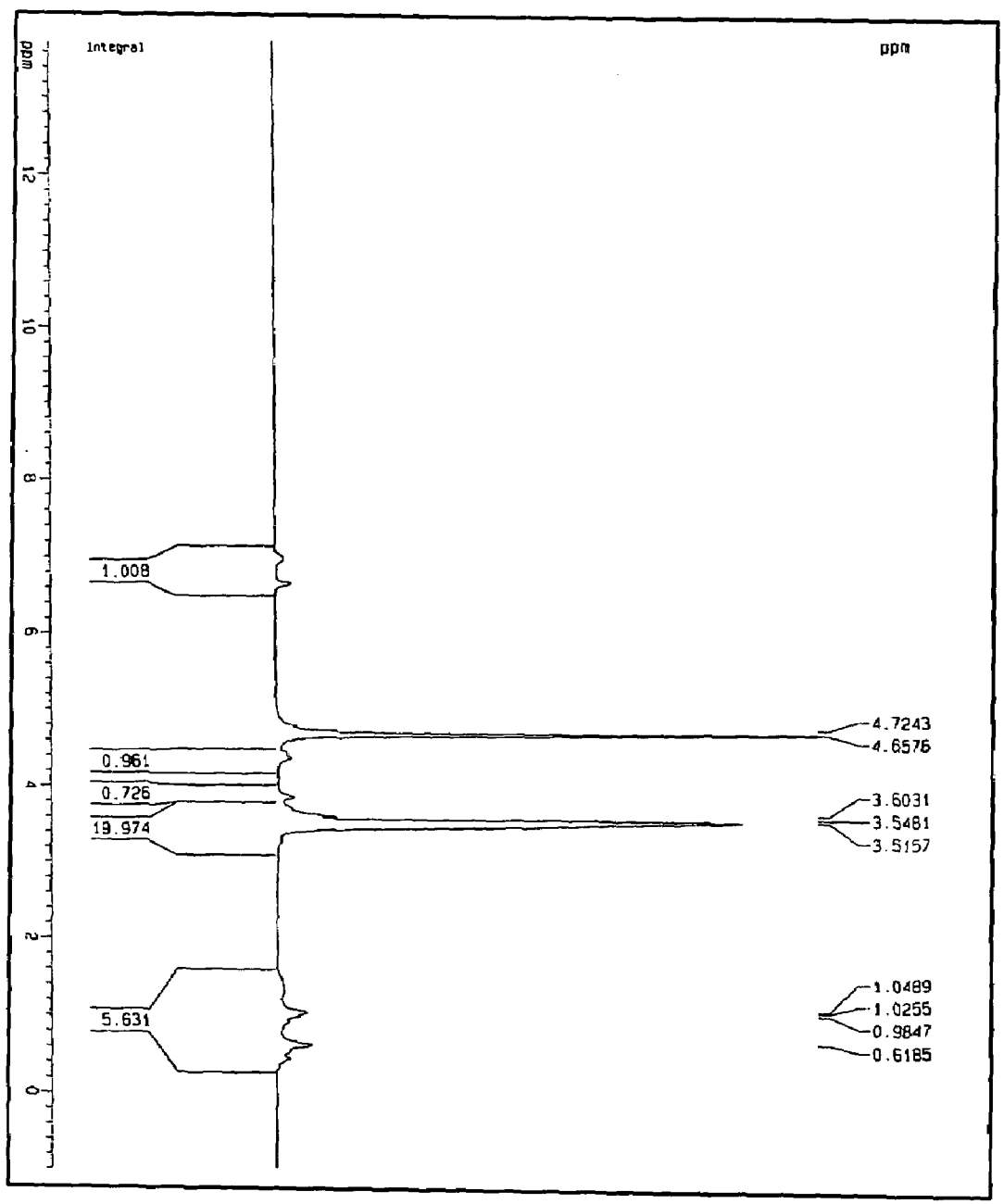
FIG. 2 is a NMR spectrum of a cleaning solution obtained from Example 2.

The present invention provides a cleaning solution for photoresist patterns comprising $H_2O$ as a primary solvent and a surfactant represented by Formula 1 as an additive:

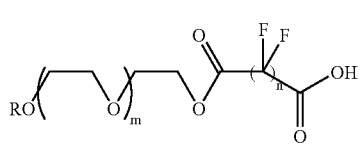

[Formula 1]

wherein

R is H, $C_8$-$C_{20}$ alkyl or alkylaryl group;

m is an integer ranging from 5 to 50; and n is an integer ranging from 3 to 50.

In the compound of Formula 1, R can be selected from the group consisting of octyl, octylphenyl, nonyl, nonylphenyl, decyl, decylphenyl, undecyl, undecyl phenyl, dodecyl, and dodecylphenyl. Preferably, m is an integer ranging from 5 to 20, and n is an integer ranging from 5 to 10.

Preferably, the compound of Formula 1 is represented by Formula 1a or 1b:

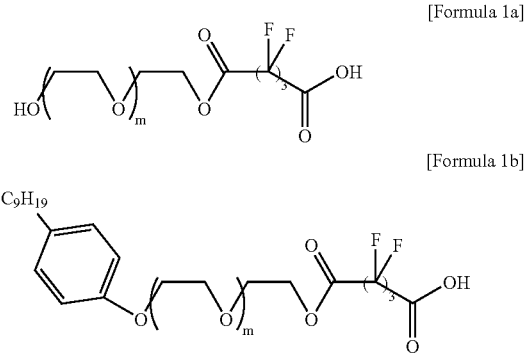

[Formula 1a]

[Formula 1b]

The compound of Formula 1 used as the surfactant in the cleaning solution of the present invention is water-soluble, and remarkably lowers surface tension, thereby preventing pattern collapse.

The water contained in the cleaning solution of the present invention is preferably distilled water.

Also, the cleaning solution can further comprise an alcohol compound.

The alcohol compound can be selected from the group consisting of $C_1$-$C_{10}$ alkyl alcohol, $C_1$-$C_{10}$ alkoxy alcohol and mixtures thereof. Preferably, the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol, and mixtures thereof, and the $C_1$-$C_{10}$ alkoxy alcohol is selected from the group consisting of 2-methoxyethanol, 2-(2-methoxyethoxy)ethanol, 1-methoxy-2-propanol and 3-methoxy-1,2-propandiol, and mixtures thereof.

In the cleaning solution, the surfactant of the cleaning solution is present in an amount ranging from 0.0001 weight percent (wt %) to 2 wt %, preferably from 0.001 wt % to 0.1 wt %, based on the total weight of said solution, and the alcohol compound is present in an amount up to 20 wt %, preferably up to 19 wt %, based on the total weight of said solution.

When the compound of Formula 1 is present in the solution in an amount of less than 0.0001 wt %, the effect of lowering surface tension is decreased. When the compound of Formula 1 is present in the amount of more than 2 wt %, the effect of lowering surface tension is also degraded and the residual compound of Formula 1 remains on the surface of the semiconductor substrate.

In addition, when the alcohol compound is present in the amount of more than 20 wt %, the alcohol compound dissolves photoresist materials, thereby causing collapse of the photoresist pattern.

The cleaning solution of the present invention can be prepared by filtering a resulting mixture of the distilled water, the compound of Formula 1 and the alcohol compound with 0.2 micrometer (μm) filter.

A method for forming a photoresist pattern comprises the steps of:

(a) coating a photoresist on top portion of the underlying layer formed on a semiconductor substrate and to be etched to form a photoresist film;

(b) exposing the photoresist film to light by using a light source;

(c) developing the exposed photoresist film in a developing solution; and, (d) cleaning the resulting material using the cleaning solution of the present invention.

The above method further comprises the step of performing a soft-baking process before the exposing step (b) or a post-baking process after the exposing step (b). Preferably, such baking process is performed at a temperature ranging from 70° C. to 200° C.

In the above exposing step, the light source is preferably selected from the group consisting of KrF (248 nm), ArF (193 nm), VUV (157 nm), EUV (13 nm), E-beam, X-ray, and ion-beam. The exposing step is preferably performed at exposure energy ranging from 0.1 to 50 millijoules per square centimeter (mJ/cm$^2$).

The above developing step (c) is performed with an alkaline developing solution which is preferably a TMAH aqueous solution ranging from 0.01 wt % to 5 wt. %.

As described above, the collapse of photoresist patterns can be prevented by performing the cleaning process using the cleaning solution of the present invention including the compound of Formula 1 which is a surfactant to decrease surface tension of the cleaning solution.

Additionally, the present invention provides a semiconductor device manufactured according to the patterning process described above.

The cleaning solution of the present invention will be described in more detail referring to the following non-limiting examples.

EXAMPLE 1

Preparation of the Surfactant (1)

To a 500 milliliter (mL) flask were added 10 grams (g) of polyethyleneglycol having a molecular weight of 1,000, 2.22 g of hexafluoro-glutaricanhydride and 0.01 g of $H_2SO_4$, and the prepared mixture was stirred at room temperature for twelve hours. After reaction, hexane (100 mL) was added to the resulting mixture and stirred, and the hexane layer was removed. Then, the residual polymer was washed with hexane once again and dried in a vacuum oven, to obtain the compound of Formula 1a (yield: 96%).

EXAMPLE 2

Preparation of the Surfactant (2)

To a 500 mL flask were added 9.4 g of polyethyleneglycolmono-4-nonylphenylether (m=20), 2.22 g of hexafluoroglutaric anhydride and 0.01 g of $H_2SO_4$. The obtained mixture was stirred at room temperature for twelve hours. After reaction, 100 mL of hexane was added to the resulting mixture and the hexane layer was removed. Then, the residual polymer was washed with hexane once again and dried in a vacuum oven, to obtain the compound of Formula 1b (yield: 98%).

EXAMPLE 3

Preparation of the Cleaning Solution (1)

0.05 g of the compound of Formula 1a obtained from Example 1 and 100 g of distilled water were mixed and stirred for one minute. The resulting mixture was filtered through a 0.2 μm filter to obtain a cleaning solution of the present invention.

EXAMPLE 4

Preparation of the Cleaning Solution (2)

0.05 g of the compound of Formula 1b obtained from Example 2, 3 g of methanol and 99 g of distilled water were mixed and stirred for one minute. The resulting mixture was filtered through a 0.2 μm filter to obtain a cleaning solution of the present invention.

EXAMPLE 5

Formation of Photoresist Pattern and Evaluation of the Effect (1)

Figure 3:
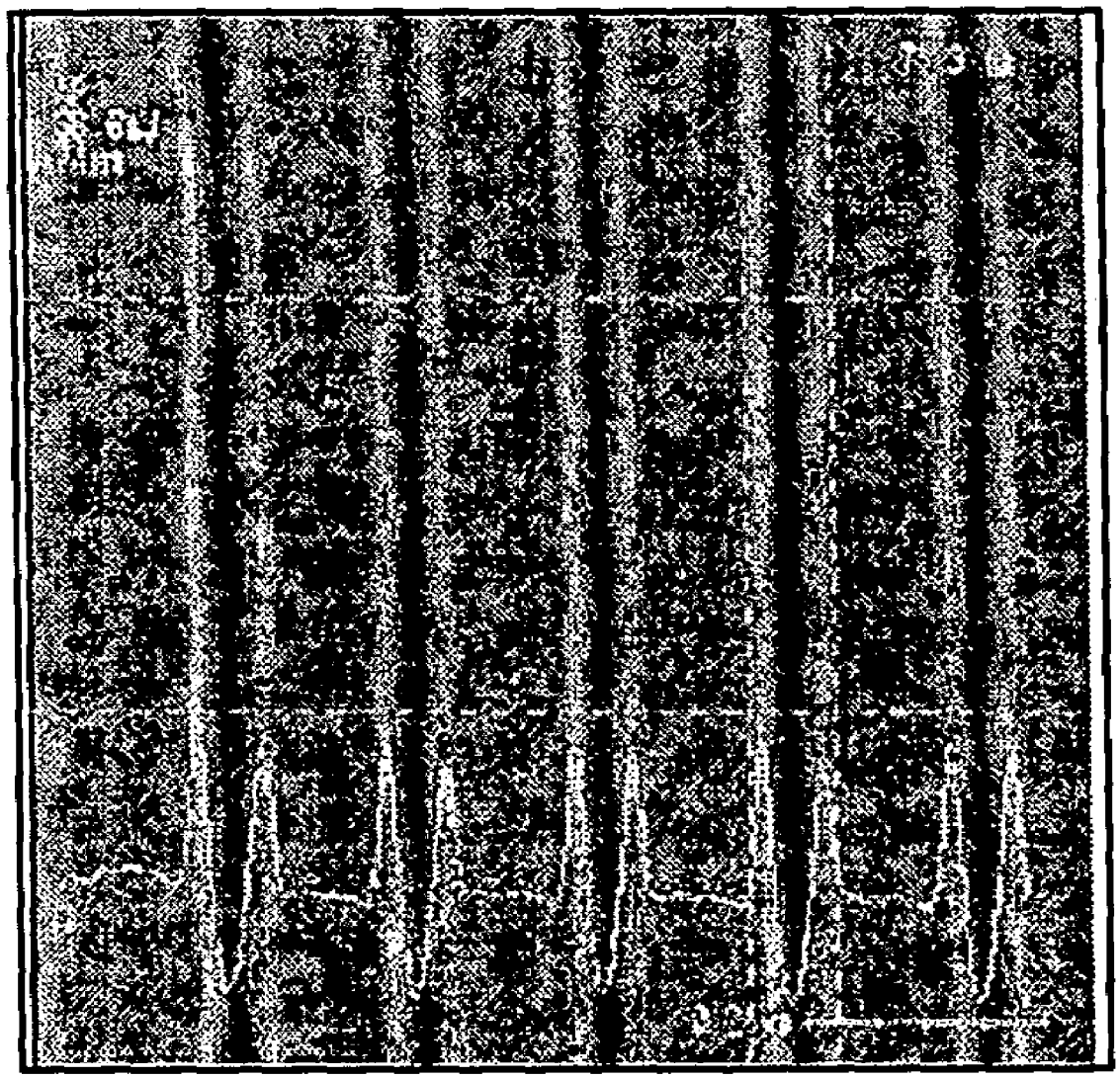
FIG. 3 is a photograph of a photoresist pattern obtained from Example 5.

After an underlying layer to be etched was formed on a silicon wafer treated with hexamethyldisilazane (HMDS), a photoresist comprising a methacrylate type compound commercially available under the designation "AX1020P" by Clariant Company was spin-coated on a top portion of the underlying layer to form a photoresist film at a thickness of 2400 Å, and soft-baked at 130° C. for 90 seconds. After the soft-baking, the photoresist film was exposed to light using an ArF laser exposer, and then post-baked at 130° C. for 90 seconds. When the post-baking was completed, the silicon wafer was developed in a 2.38 wt. % aqueous TMAH solution for 30 seconds. While the silicon wafer was spun, the silicon wafer was cleaned by spraying the cleaning solution (30 mL) obtained from Example 3 and then was dried to obtain a 74 nm Line/86 nm Space ultrafine photoresist pattern (see FIG. 3). The Ec which refers to the energy of first pattern collapse in the photoresist patterning process was measured as 37 mJ/cm$^2$.

EXAMPLE 6

Formation of Photoresist Pattern and Evaluation of the Effect (2)

Figure 4:
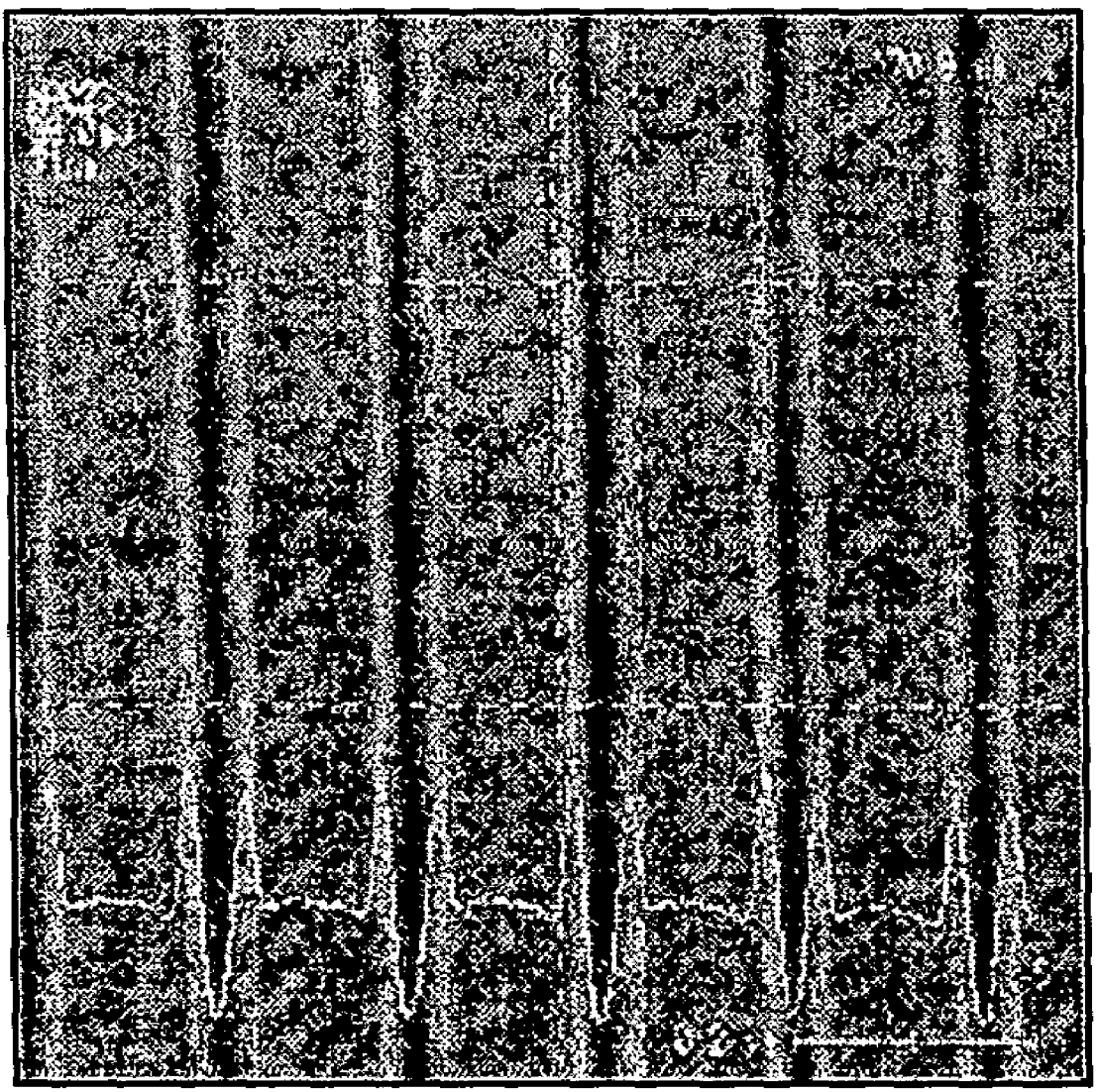
FIG. 4 is a photograph of a photoresist pattern obtained from Example 6.

The same procedure of Example 5 was performed using the cleaning solution of Example 4 instead of the cleaning solution of Example 3 to obtain a photoresist pattern. As a result, 74 nm Line/86 nm Space ultrafine photoresist pattern was obtained (see FIG. 4). The Ec was measured as 38.2 mJ/cm$^2$ in this case.

COMPARATIVE EXAMPLE

Formation of Photoresist Pattern and Evaluation of the Effect (3)

Figure 5:
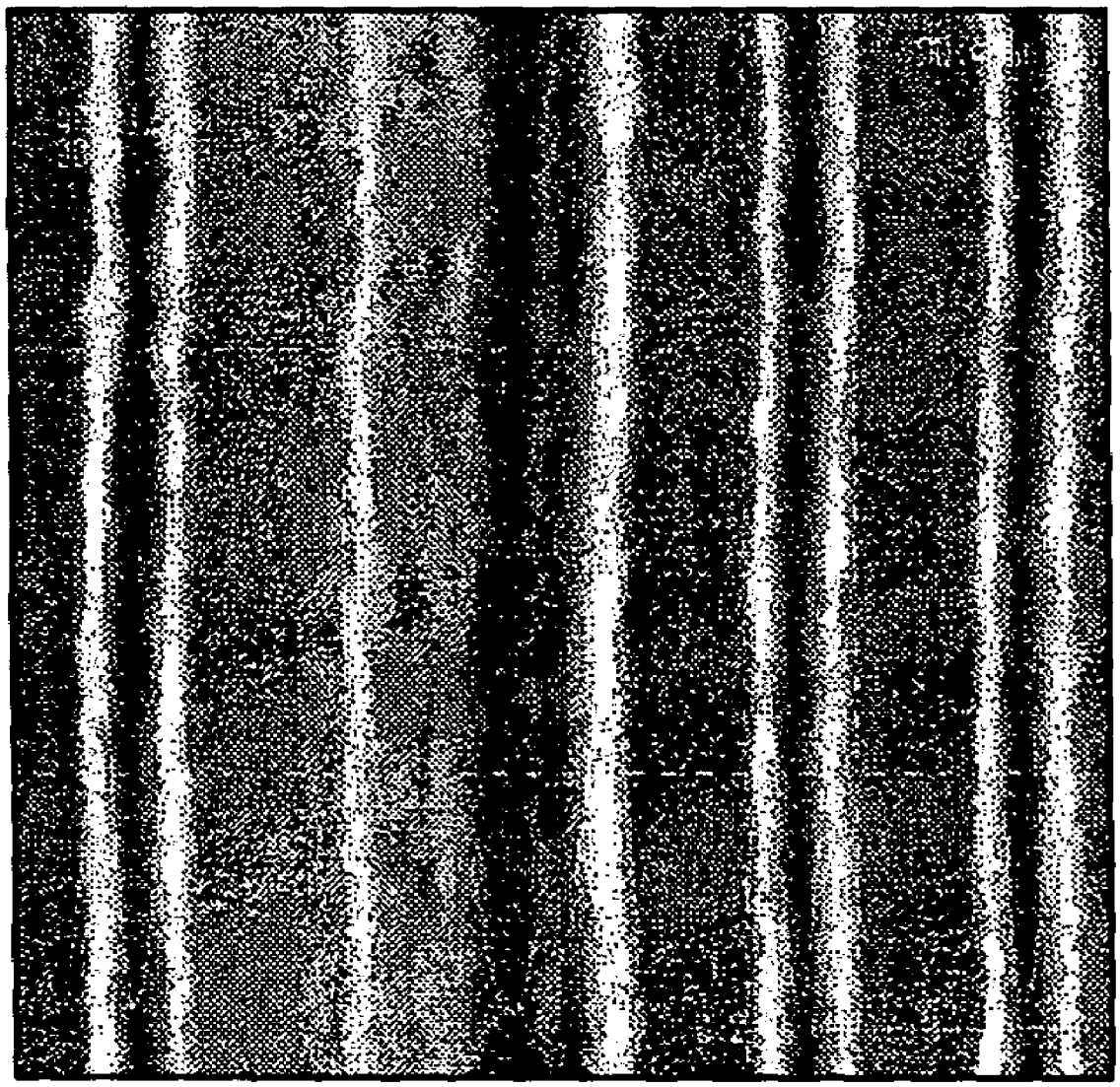
FIG. 5 is a photograph of a photoresist pattern obtained from the Comparative Example.

The same procedure of Example 5 was performed using distilled water instead of the cleaning solution of Example 3 to obtain a photoresist pattern. As a result, the photoresist pattern collapsed (see FIG. 5). The Ec was measured as 33 mJ/cm$^2$.

As described hereinbefore, the pattern collapse can be avoided by using the cleaning solution of the present invention in the last step of the development because the cleaning solution of the present invention has a lower surface tension than distilled water. Accordingly, the cleaning solution of the present invention can be useful for the stabilization of development processes for forming ultrafine photoresist patterns of less than 130 nm.

What is claimed is:

1. A cleaning solution for photoresist patterns comprising H$_2$O as a primary solvent and a surfactant of Formula 1 as an additive:

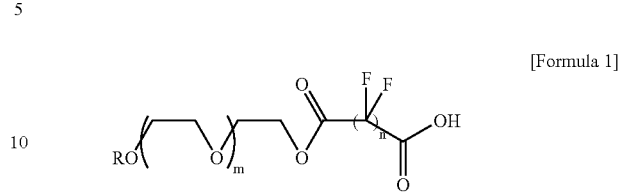

[Formula 1]

wherein
R is H, C$_8$-C$_{20}$ alkyl or alkylaryl group;
m is an integer ranging from 5 to 50; and
n is an integer ranging from 3 to 50.

2. The cleaning solution according to claim 1, wherein the cleaning solution further comprises an alcohol compound.

3. The cleaning solution according to claim 1 wherein the surfactant of the cleaning solution is present in an amount ranging from 0.0001 wt % to 2 wt % based on the total weight of the cleaning solution, and the cleaning solution further comprises an alcohol compound present in an amount up to 20 wt % based on the total weight of the cleaning solution.

4. The cleaning solution according to claim 3, wherein the surfactant of the cleaning solution is present in an amount ranging from 0.001 wt % to 0.1 wt % based on the total weight of the cleaning solution, and the alcohol compound is present in an amount up to 10 wt % based on the total weight of the cleaning solution.

5. The cleaning solution according to claim 1, wherein R is selected from the group consisting of octyl, octylphenyl, nonyl, nonylphenyl, decyl, decylphenyl, undecyl, undecylphenyl, dodecyl, and dodecylphenyl, and m is an integer ranging from 5 to 20, and n is an integer ranging from 5 to 10.

6. The cleaning solution according to claim 1, wherein the compound of Formula 1 is represented by Formula 1a or 1b:

[Formula 1a]

[Formula 1b]

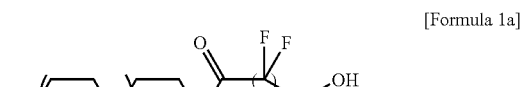

7. The cleaning solution according to claim 2, wherein the alcohol compound is selected from the group consisting of C$_1$-C$_{10}$ alkyl alcohol, C$_1$-C$_{10}$ alkoxy alcohol, and mixtures thereof.

8. The cleaning solution according to claim 7, wherein the C$_1$-C$_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol, and mixtures thereof.

9. The cleaning solution according to claim 7, wherein the $C_1$-$C_{10}$ alkoxy alcohol is selected from the group consisting of 2-methoxyethanol, 2-(2-methoxyethoxy) ethanol, 1-methoxy-2-propanol and 3-methoxy-1,2-propanediol, and mixtures thereof.

10. The cleaning solution according to claim 1, wherein the solution comprises a compound of Formula 1a and distilled water.

[Formua 1a]

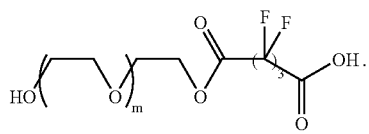

11. The cleaning solution according to claim 10, wherein the compound of Formula 1a is present in an amount ranging from 0.0001 wt % to 2 wt % based on the total weight of the cleaning solution and residual distilled water.

12. The cleaning solution according to claim 1, wherein the solution comprises a compound of Formula 1b, methanol, and distilled water:

[Formula 1b]

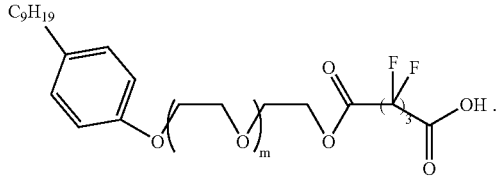

13. The cleaning solution according to claim 12, wherein the compound of Formula 1b is present in an amount ranging from 0.0001 wt % to 2 wt %, methanol is present in an amount up to 10 wt % based on the total weight of the cleaning solution and residual distilled water.

* * * * *